(12) United States Patent
Lee

(10) Patent No.: US 11,482,650 B2
(45) Date of Patent: Oct. 25, 2022

(54) LIGHT EMITTING DEVICE INCLUDING LIGHT SHIELDING LAYER

(71) Applicant: SEOUL VIOSYS CO., LTD., Ansan-si (KR)

(72) Inventor: Chung Hoon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 81 days.

(21) Appl. No.: 16/672,691

(22) Filed: Nov. 4, 2019

(65) Prior Publication Data

US 2020/0144465 A1 May 7, 2020

Related U.S. Application Data

(60) Provisional application No. 62/756,901, filed on Nov. 7, 2018.

(51) Int. Cl.
| | |
|---|---|
| *H01L 33/58* | (2010.01) |
| *H01L 27/15* | (2006.01) |
| *H01L 33/62* | (2010.01) |
| *H01L 33/38* | (2010.01) |

(52) U.S. Cl.
CPC ............ *H01L 33/58* (2013.01); *H01L 27/156* (2013.01); *H01L 33/382* (2013.01); *H01L 33/62* (2013.01)

(58) Field of Classification Search
CPC ....... H01L 33/58; H01L 27/156; H01L 33/08; H01L 33/62; H01L 33/382; H01L 33/44
See application file for complete search history.

(56) References Cited

U.S. PATENT DOCUMENTS

| | | | |
|---|---|---|---|
| 8,269,238 B2 | 9/2012 | Kim et al. | |
| 9,853,194 B2 | 12/2017 | Minato et al. | |
| 2005/0140805 A1 | 6/2005 | Han | |
| 2016/0197235 A1 | 7/2016 | Sung et al. | |
| 2016/0351620 A1 | 12/2016 | Tanaka | |
| 2017/0066168 A1* | 3/2017 | Ludwig | H01L 33/58 |
| 2020/0083281 A1* | 3/2020 | Wu | H01L 33/62 |

FOREIGN PATENT DOCUMENTS

| | | |
|---|---|---|
| EP | 2216834 | 3/2017 |
| JP | 2006-278751 | 10/2006 |
| JP | 2008251561 | 10/2008 |
| KR | 10-0856282 | 9/2008 |
| KR | 10-2016-0010036 | 1/2016 |
| TW | 201543066 | 11/2015 |

OTHER PUBLICATIONS

International Search Report dated Feb. 17, 2020 in International Application No. PCT/KR2019/015092.
Extended European Search Report dated Jul. 5, 2022, issued in European Patent Application No. 19981942.7.

* cited by examiner

*Primary Examiner* — Daniel Luke
(74) *Attorney, Agent, or Firm* — H.C. Park & Associates, PLC

(57) ABSTRACT

A light emitting device including a substrate having a first surface and a second surface opposing each other, a plurality of light emitting parts disposed on the first surface of the substrate and defining a light emitting area, and a light shielding layer disposed on the second surface of the substrate and exposing at least a portion of the light emitting area, in which the light shielding layer has a thickness greater than a length of the longest wavelength among wavelengths of light generated from the light emitting parts.

20 Claims, 13 Drawing Sheets

LIGHT EMITTING DEVICE INCLUDING LIGHT SHIELDING LAYER

CROSS-REFERENCE TO RELATED APPLICATION

This application claims the benefit of U.S. Provisional Patent Application No. 62/756,901, filed on Nov. 7, 2018, which is hereby incorporated by reference for all purposes as if fully set forth herein.

BACKGROUND

Field

Exemplary embodiments of the invention relates generally to a light emitting device, and more specifically, to a light emitting device including a plurality of light emitting parts.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and faster response speed than existing light sources.

In general, a display device displays various colors by utilizing mixed colors of blue, green, and red. Each pixel of a display device includes blue, green, and red sub-pixels, the color of a particular pixel is determined through the colors of these sub-pixels, and an image is displayed by a combination of pixels.

Light emitting diodes have been mainly used as backlight sources in display devices. However, recently, a micro LED display has been developed as a next generation display, which may directly display images by using light emitting diodes.

The above information disclosed in this Background section is only for understanding of the background of the inventive concepts, and, therefore, it may contain information that does not constitute prior art.

SUMMARY

Devices constructed according to exemplary embodiments of the invention are capable of suppressing color mixing and improving light reproducibility.

Additional features of the inventive concepts will be set forth in the description which follows, and in part will be apparent from the description, or may be learned by practice of the inventive concepts.

A light emitting device according to an exemplary embodiment includes a substrate having a first surface and a second surface opposing each other, a plurality of light emitting parts disposed on the first surface of the substrate and defining a light emitting area, and a light shielding layer disposed on the second surface of the substrate and exposing at least a portion of the light emitting area, in which the light shielding layer has a thickness greater than a length of the longest wavelength among wavelengths of light generated from the light emitting parts.

The light shielding layer may define a light extraction surface by covering peripheries of the light emitting parts.

A width of the light extraction surface may be less than the thickness of the light shielding layer.

The light shielding layer may have a side surface including a rough surface.

The light shielding layer may include a first surface facing the second surface of the substrate and a second surface opposing the first surface thereof, and the second surface of the light shielding layer may have a concaved surface.

The light shielding layer may have a sidewall that is vertical with respect to a longitudinal direction of the substrate.

The light shielding layer may have an inclined sidewall with respect to a longitudinal direction of the substrate.

The light shielding layer may have a first surface facing the second surface of the substrate and a second surface opposing the first surface thereof, and the light shielding layer may have a width that increases from the first surface of the light shielding layer to the second surface of the light shielding layer.

A light emitting device according to another exemplary embodiment includes a substrate having a first surface and a second surface opposing each other, a plurality of light emitting parts disposed one over another on the first surface of the substrate, a plurality of vias at least partially passing through one of the light emitting parts, a plurality of pads disposed on the light emitting parts and electrically connected to each of the light emitting parts through the vias, and a first shielding layer disposed on the first surface of the substrate between the light emitting parts, in which an upper surface of each pad and an upper surface of the first shielding layer are disposed on the same plane.

The first shielding layer may contact a side surface of the pads.

A sidewall of each of the light emitting parts may be linearly inclined with respect to a longitudinal direction of the substrate at a predetermined angle.

At at least one of the light emitting parts may be configured to emit light having a wavelength different from those emitted from the remaining light emitting parts.

At least one of the pads may be electrically connected to each of the light emitting parts.

Each of the light emitting parts may include a first-type semiconductor layer, an active layer, and a second-type semiconductor layer disposed one over another along a first direction, and at least one of the light emitting parts may have a stacked sequence of the first-type semiconductor layer, the active layer, and the second-type semiconductor layer different from those of the remaining light emitting parts along the first direction.

Each of the pads may overlap at least one of the vias in plan view, and a first one of the pads may overlap a greater number of the vias than the remaining pads.

Each of the light emitting parts may include a first-type semiconductor layer, an active layer, and a second-type semiconductor layer disposed one over another along a first direction, and the vias electrically connected to the first one of the pads may be electrically connected to the same-type semiconductor layers of the light emitting parts, respectively.

At least one of the first-type semiconductor layer and the second-type semiconductor layer may further include an ohmic layer.

The light emitting device may further include a second shielding layer disposed on the second surface of the substrate.

The second shielding layer may include a plurality of openings disposed to respectively overlap at least a portion of the light emitting parts and exposing the substrate.

The second shielding layer may include a first surface facing away the substrate and a side surface defined by the openings, and the first surface and the side surface of the second shielding layer may have different shapes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
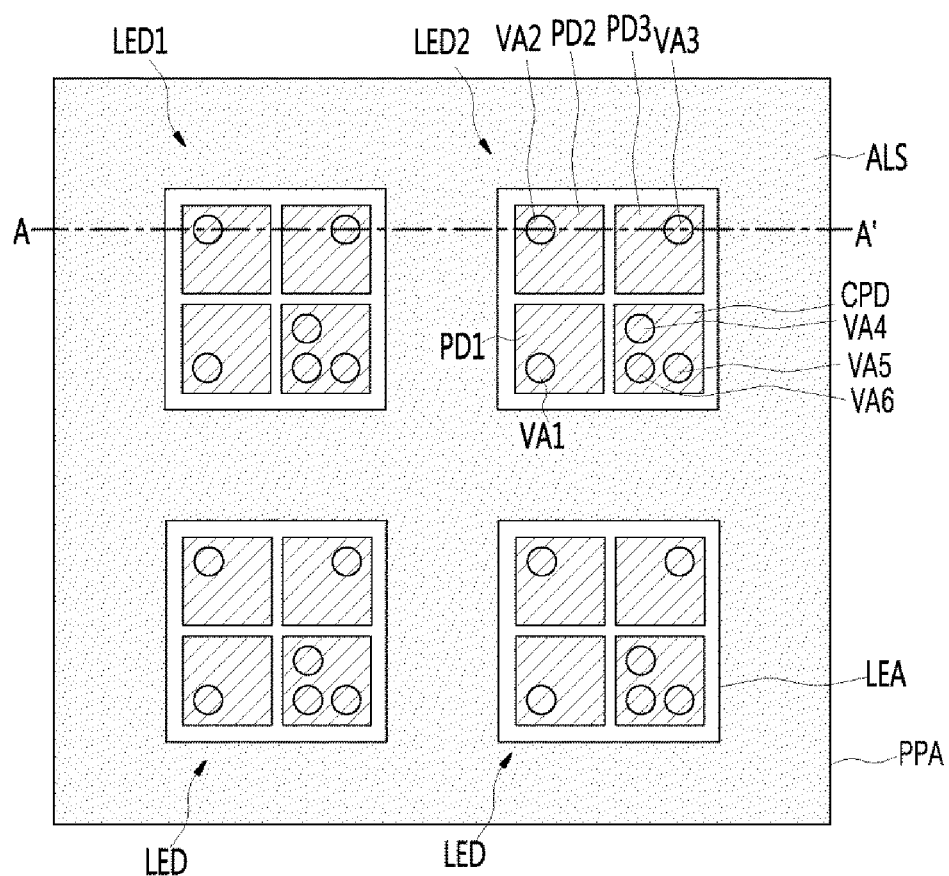
FIGS. 1A and 1B are top views of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
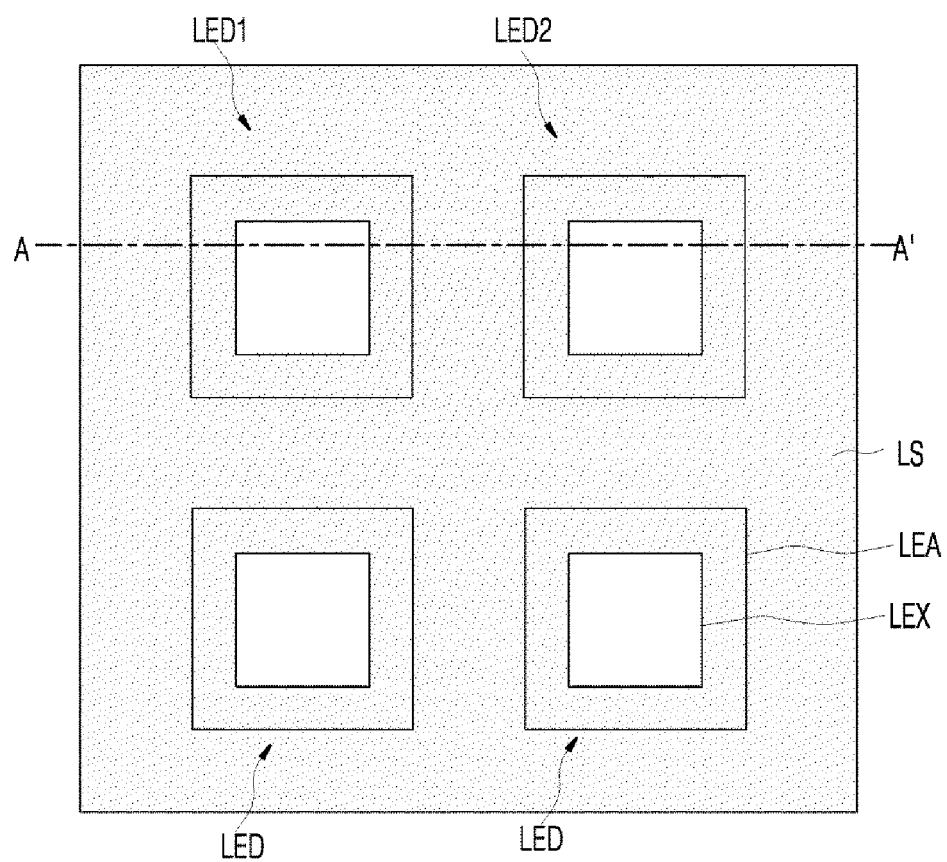

FIGS. 1A and 1B are top views of a light emitting device according to an exemplary embodiment. FIGS. 2A, 2B, 2C, and 2D are cross-sectional views taken along lines A-A' of FIGS. 1A and 1B. FIG. 3A is a top view of a light emitting structure of the light emitting device shown in FIG. 1A, and FIG. 3B is a cross-sectional view taken along lines A-A' and B-B' of FIG. 3A.

FIG. 1A is a planar view obtained when viewed from the pads of a light emitting device, and FIG. 1B is a planar view obtained when viewed from the light extraction surface of the light emitting device. FIG. 3A is a planar view obtained when viewed from the pads of the light emitting device.

Referring to FIGS. 1A to 2D, a light emitting device may include a substrate 100 having a first surface SF1_S and a second surface SF2_S opposing the first surface SF1_S, a plurality of light emitting parts LE1, LE2, and LE3 disposed on the first surface SF1_S of the substrate 100, and a light shielding layer LS disposed on the second surface SF2_S of the substrate 100.

The substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), or silicon. Also, the substrate 100 may be a patterned sapphire substrate. In some exemplary embodiments, the substrate 100 may include a material that transmits visible light.

Referring to FIGS. 3A and 3B, the light emitting device may include light emitting structures LED, in which a first light emitting part LE1, a second light emitting part LE2, and a third light emitting part LE3 are vertically stacked. The substrate 100 may include light emitting areas LEA, in which the light emitting structures LED are disposed, and a peripheral area PPA around the light emitting areas LEA. For example, when each of the light emitting structures LED has a width that gradually increases from the third light emitting part LE3 to the first light emitting part LE1, each of the light emitting areas LEA may have a first width W1 that is substantially the same as the largest width of each light emitting structure LED.

When the second surface SF2_S of the substrate 100 includes a light extraction surface LEX, the wavelength of light emitted from the first light emitting part LE1 may be the shortest, the wavelength of light emitted from the second light emitting part LE2 may be longer than the wavelength of light emitted from the first light emitting part LE1 and be shorter than the wavelength of light emitted from the third light emitting part LE3, and the wavelength of light emitted from the third light emitting part LE3 may be longest. For example, the first light emitting part LE1 may emit blue light, the second light emitting part LE2 may emit green light, and the third light emitting part LE3 may emit red light. In this case, light generated from the first light emitting part LE1 may have a wavelength of about 450 nm to about 495 nm, light generated from the second light emitting part LE2 may have a wavelength of about 495 nm to about 570 nm, and light generated from the third light emitting part LE3 may have a wavelength of about 620 nm to about 750 nm. However, the inventive concepts are not limited thereto. For example, in some exemplary embodiments, the second light emitting part LE2 may emit light having a shorter wavelength than that emitted from the first light emitting part LE1.

The first light emitting part LE1 may include a first n-type semiconductor layer 102, a first active layer 104, a first p-type semiconductor layer 106, and a first ohmic layer 108, the second light emitting part LE2 may include a second n-type semiconductor layer 202, a second active layer 204, a second p-type semiconductor layer 206, and a second ohmic layer 208, and the third light emitting part LE3 may include a third n-type semiconductor layer 302, a third active layer 304, a third p-type semiconductor layer 306, and a third ohmic layer 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208 and the third ohmic layer 308, a transparent conductive oxide (TCO), such as tin oxide (SnO), indium oxide ($InO_2$), zinc oxide (ZnO), indium tin oxide (ITO), or indium tin zinc oxide (ITZO) may be used.

The first light emitting part LE1 may be spaced apart from the second light emitting part LE2. For example, the first ohmic layer 108 of the first light emitting part LE1 and the second ohmic layer 208 of the second light emitting part LE2 may face each other. As another example, the first ohmic layer 108 of the first light emitting part LE1 and the second n-type semiconductor layer 202 of the second light emitting part LE2 may face each other.

The second light emitting part LE2 may be spaced apart from the third light emitting part LE3. For example, the second n-type semiconductor layer 202 of the second light emitting part LE2 and the third ohmic layer 308 of the third light emitting part LE3 may face each other. As another example the second ohmic layer 208 of the second light emitting part LE2 and the third n-type semiconductor layer 302 of the third light emitting part LE3 may face each other.

The light emitting device may further include a first adhesion part AD1 disposed between the first light emitting part LE1 and the second light emitting part LE2 to bond the first light emitting part LE1 and the second light emitting part LE2, and a second adhesion part AD2 disposed between the second light emitting part LE2 and the third light emitting part LE3 to bond the second light emitting part LE2 and the third light emitting part LE3. Each of the first adhesion part AD1 and the second adhesion part AD2 may include a material that transmits visible light and has an insulation property. Each of the first adhesion part AD1 and the second adhesion part AD2 may include a polymer, a resist, or a polyimide. For example, each of the first adhesion part AD1 and the second adhesion part AD2 may include SOG (spin-on-glass), BCB (benzo cyclo butadiene), HSQ (hydrogen silsesquioxanes), or an SU-8 photoresist.

The light emitting device may further include a first color filter CF1 disposed between the first light emitting part LE1 and the second light emitting part LE2, and a second color filter CF2 disposed between the second light emitting part LE2 and the third light emitting part LE3. The first color filter CF1 may be disposed on the first ohmic layer 108 of the first light emitting part LE1 or the second ohmic layer 208 of the second light emitting part LE2. The second color filter CF2 may be disposed on the second n-type semiconductor layer 202 of the second light emitting part LE2 or the third ohmic layer 308 of the third light emitting part LE3. The first color filter CF1 may reflect light emitted from the first light emitting part LE1 and pass light emitted from the second light emitting part LE2 and the third light emitting part LE3, such that light emitted from the first light emitting part LE1 does not exert an influence on each of the second light emitting part LE2 and the third light emitting part LE3. The second color filter CF2 may reflect light emitted from the first light emitting part LE1 and the second light emitting part LE2 and pass light emitted from the third light emitting part LE3, such that light emitted from the first light emitting part LE1 and the second light emitting part LE2 does not exert an influence on the third light emitting part LE3. Each of the first color filter CF1 and the second color filter CF2 may include a distributed Bragg reflector (DBR), in which $TiO_2$ and $SiO_2$ are alternately stacked. The first color filter CF1 may be different from the second color filter CF2 in terms of the alternation number and thickness of TiO2 and SiO2. In some exemplary embodiments, at least one of the first color filter CF1 and the second color filter CF2 may be selectively omitted.

The light emitting device may further include a first via pattern VA1, which passes through the third light emitting part LE3, the second color filter CF2, the second adhesion part AD2, the second light emitting part LE2, the first adhesion part AD1, and the first color filter CF1 and is brought into electrical contact with the first ohmic layer 108, a second via pattern VA2, which passes through the third light emitting part LE3, the second color filter CF2, the second adhesion part AD2, the second n-type semiconductor layer 202, the second active layer 204, and the second p-type semiconductor layer 206 and is brought into electrical contact with the second ohmic layer 208, and a third via pattern VA3, which passes through the third n-type semiconductor layer 302, the third active layer 304, and the third p-type semiconductor layer 306 and is brought into electrical contact with the third ohmic layer 308. Also, the light emitting device may further include a fourth via pattern VA4, which passes through the third light emitting part LE3, the second color filter CF2, the second adhesion part AD2, the second light emitting part LE2, the first adhesion part AD1, the first color filter CF1, the first ohmic layer 108, the first p-type semiconductor layer 106, and the first active layer 104 and is brought into electrical contact with the first n-type semiconductor layer 102, a fifth via pattern VA5, which passes through the third light emitting part LE3, the second color filter CF2, and the second adhesion part AD2 and is brought into electrical contact with the second n-type semiconductor layer 202, and a sixth via pattern VA6, which is brought into electrical contact with the third n-type semiconductor layer 302.

The light emitting device may further include a first pad PD1 electrically coupled with the first ohmic layer 108 through the first via pattern VA1, a second pad PD2 electrically coupled with the second ohmic layer 208 through the second via pattern VA2, a third pad PD3 electrically coupled with the third ohmic layer 308 through the third via pattern VA3, and a common pad CPD electrically coupled in common with the first n-type semiconductor layer 102, the second n-type semiconductor layer 202, and the third n-type semiconductor layer 302 through the fourth, fifth, and sixth via patterns VA4, VA5, and VA6, respectively. According to an exemplary embodiment, each of the first pad PD1, the second pad PD2, the third pad PD3, and the common pad CPD may be disposed on the third light emitting part LE3.

While the common pad CPD is illustrated as being coupled in common with the first n-type semiconductor layer 102, the second n-type semiconductor layer 202, and the third n-type semiconductor layer 302, however, the inventive concepts are not limited thereto. For example, in some exemplary embodiments, the common pad CPD may be coupled in common with the first ohmic layer 108, the second ohmic layer 208, and the third ohmic layer 308.

The light emitting device may further include a passivation layer PVT, which surrounds the outer sidewalls of the first via pattern VA1, the second via pattern VA2, the third via pattern VA3, the fourth via pattern VA4, the fifth via pattern VA5, and the sixth via pattern VA6, and extends onto the third light emitting part LE3.

While the light emitting parts are illustrated as including the first light emitting part LE1, the second light emitting part LE2, and the third light emitting part LE3 that are vertically stacked, and that the light emitting device is illustrated as including the via patterns VA1, VA2, VA3, VA4, VA5, and VA6 passing through the first light emitting part LE1, the second light emitting part LE2, and the third light emitting part LE3, however, the inventive concepts are not limited thereto. For example, according to another exemplary embodiment, by etching the vertically stacked first light emitting part LE1, second light emitting part LE2, and third light emitting part LE3, the light emitting device may have a mesa structure, which exposes the first n-type semiconductor layer 102, the second n-type semiconductor layer 202, the third n-type semiconductor layer 302, the first ohmic layer 108, the second ohmic layer 208, and the third ohmic layer 308. Moreover, in some exemplary embodiments, the light emitting device may have a structure, in which the first light emitting part LE1, the second light emitting part LE2 and the third light emitting part LE3, are horizontally disposed on the same plane.

Referring to FIGS. 1A to 2D, the light shielding layer LS may include a plurality of holes HL, each exposing at least a portion of corresponding light emitting area LEA on the second surface SF2_S of the substrate 100. Each of the holes HL of the light shielding layer LS defines the light extraction surface LEX, and light emitted from the light extraction surface LEX may be emitted through the hole HL exposing the light extraction surface LEX. More particularly, each hole HL may function as a light extraction path.

According to an exemplary embodiment, each light extraction surface LEX in the light emitting area LEA may have a second width W2 less than the first width W1 of the light emitting area LEA. The center of the light extraction surface LEX may be substantially the same as the center of the light emitting area LEA.

The light shielding layer LS may include metal, such as Ti, Ni, Al, Ag, and Cr, or may include a material, such as a photoresist, epoxy, PDMS (polydimethylsiloxane), and a black matrix.

According to an exemplary embodiment, a thickness TH of the light shielding layer LS may be equal to or greater than a length of the longest wavelength among the wavelengths of light generated by the light emitting parts LE1, LE2, and LE3. For example, when the first light emitting part LE1 emits blue light having the wavelength of about 450 nm to about 495 nm, the second light emitting part LE2 emits green light having the wavelength of about 495 nm to about 570 nm, and the third light emitting part LE3 emits red light having the wavelength of about 620 nm to about 750 nm, the thickness TH of the light shielding layer LS may be equal to or greater than the wavelength of light generated from the third light emitting part LE3.

According to an exemplary embodiment, the second width W2 of the light extraction surface LEX defined by the light shielding layer LS may be less than the thickness TH of the light shielding layer LS. For example, when a distance DT between the centers of adjacent light emitting structures LED is about 80 μm, the second width W2 may be about 5 μm.

By defining the light extraction surface LEX to be smaller than the light emitting area LEA by using the light shielding layer LS, the light emitting device may have an improved contrast and color reproducibility.

In this case, since the width of the light extraction surface LEX is small, light passed through the light shielding layer LS may be spread by diffraction, which may cause an image displayed by light emitted from the light emitting device may be blurred. As such, by forming the light shielding layer LS to have a thickness TH greater than the longest wavelength among the wavelengths of light generated from the light emitting parts LE1, LE2, and LE3, the diffraction of light may be vanished while passing through the light shielding layer LS to suppress blurring of an image displayed.

Figure 2A:
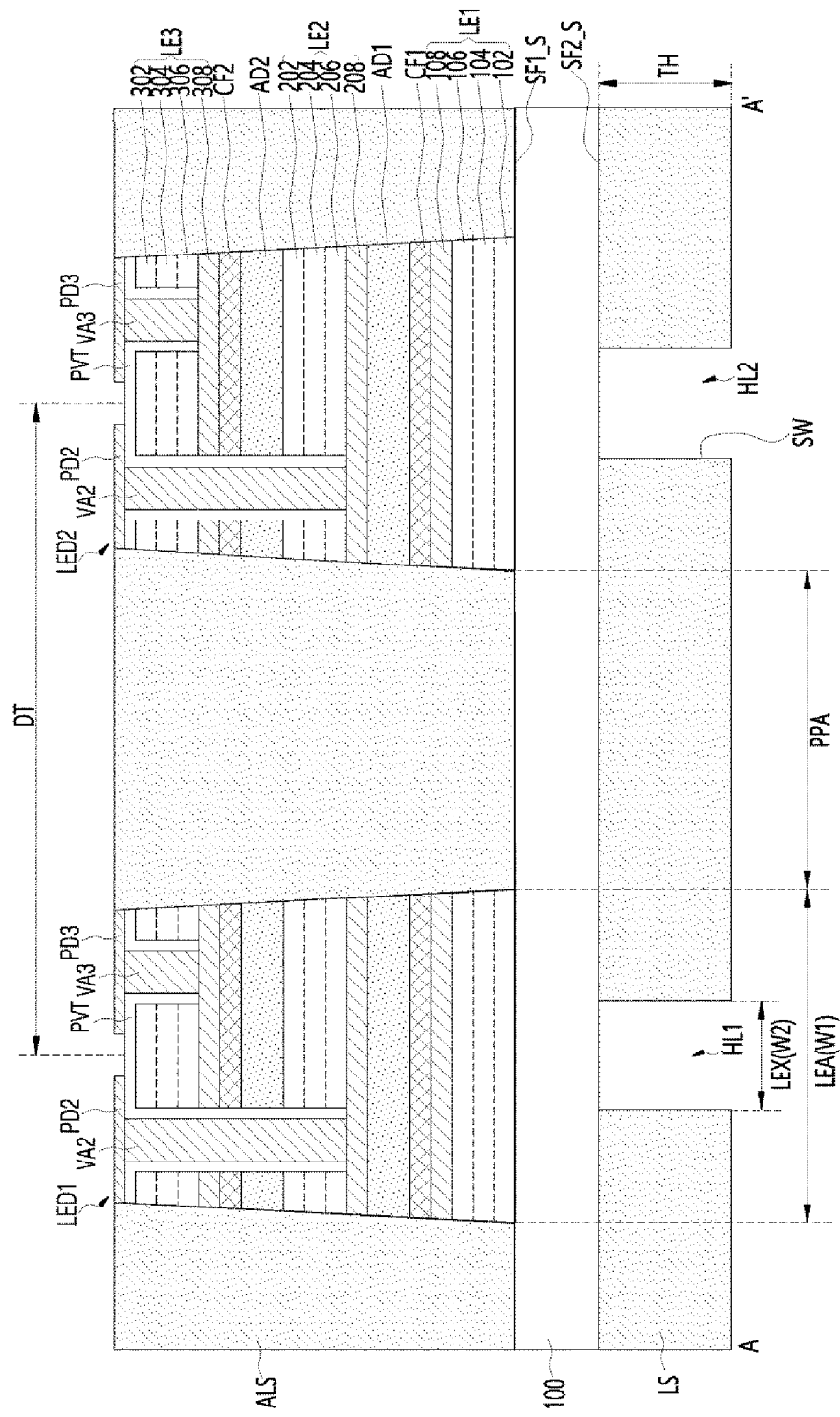
FIGS. 2A, 2B, 2C, and 2D are cross-sectional views taken along lines A-A' of FIGS. 1A and 1B according to exemplary embodiments.
Figure 3A:
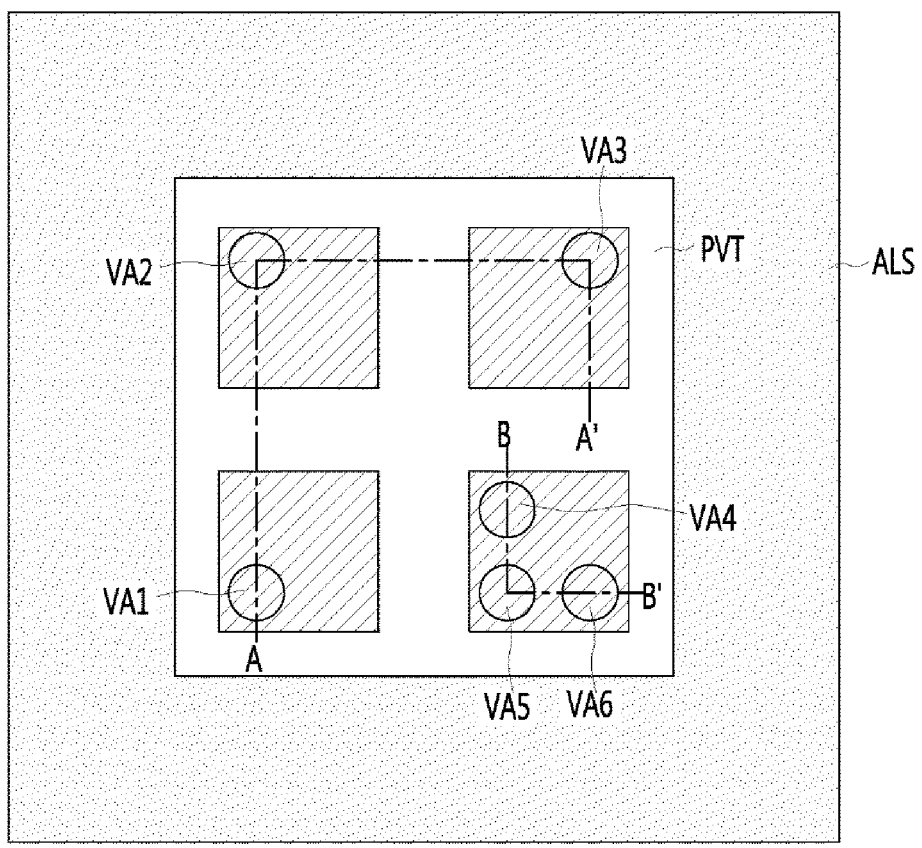
FIG. 3A is a top view of a light emitting structure of the light emitting device of FIG. 1A.
Figure 3B:
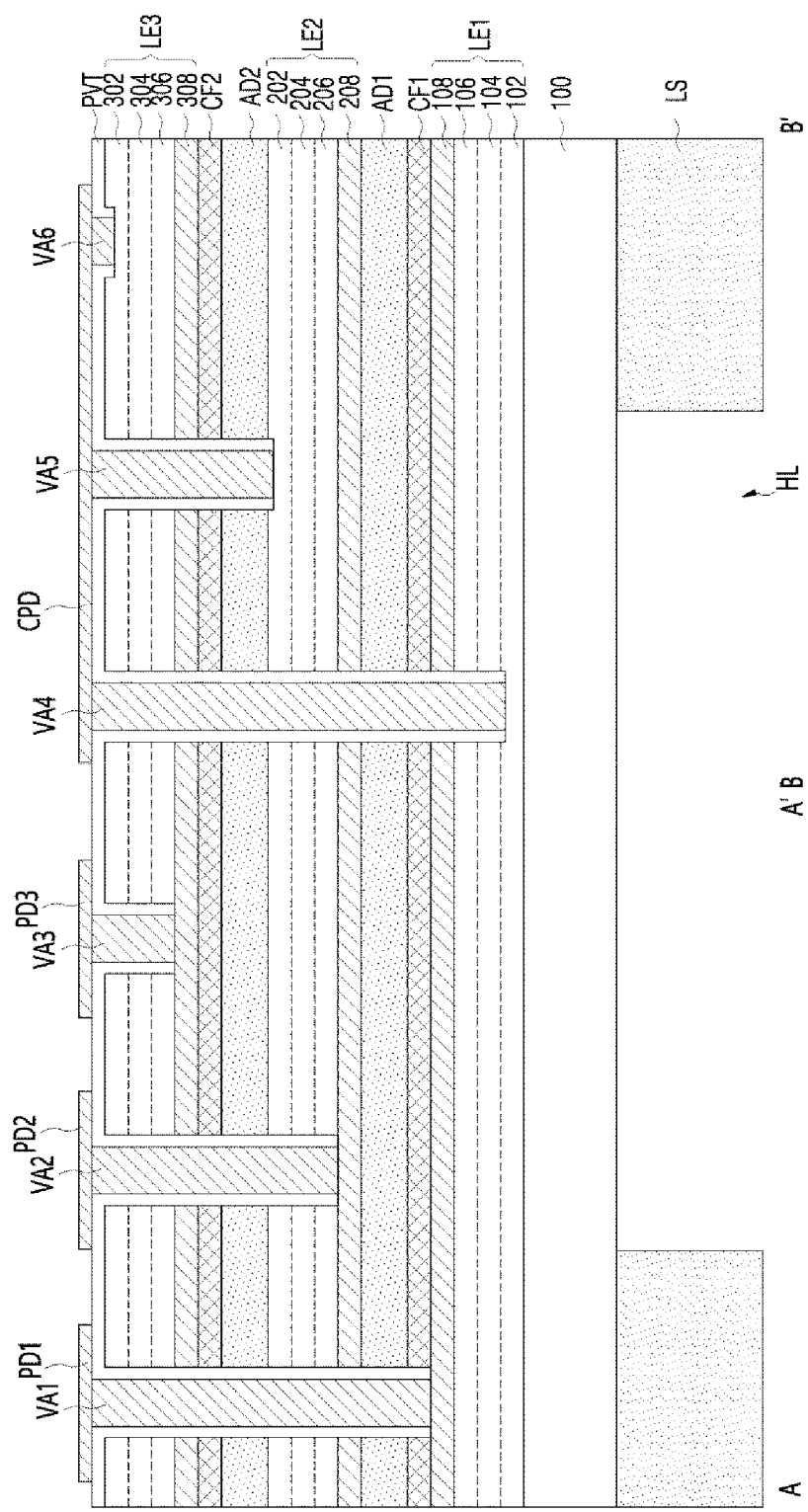
FIG. 3B is a cross-sectional view taken along lines A-A' and B-B' of FIG. 3A.

Referring to FIG. 2A, the sidewall SW exposed by the hole HL of the light shielding layer LS according to the illustrated exemplary embodiment may be vertical to the substrate 100. The light shielding layer LS may have substantially a constant thickness TH.

Hereinbelow, the light emitting structures LED will be described with reference to a first light emitting structure LED1 and a second light emitting structure LED2, and the holes HL will be described with reference to a first hole HL1 and a second hole HL2. The first light emitting structure LED1 may emit light through the first hole HL1, and the second light emitting structure LED2 may emit light through the second hole HL2.

While light generated from the first light emitting structure LED1 should be emitted through the first hole HL1, a fraction of light may be reflected and radiated to the neighboring second hole HL2 by using the substrate 100 as a light guide path. Light generated from the first light emitting structure LED1, which is reflected and radiated to the second hole HL2, may have a decreased intensity as a portion of light may be vanished while passing through the substrate 100, and while passing through the thick light shielding layer LS towards the second hole HL2. Also, even when light generated from the first light emitting structure LED1 is emitted through the first hole HL1, a diffraction phenomenon may be vanished while light passes through the thick light shielding layer LS.

Figure 2B:
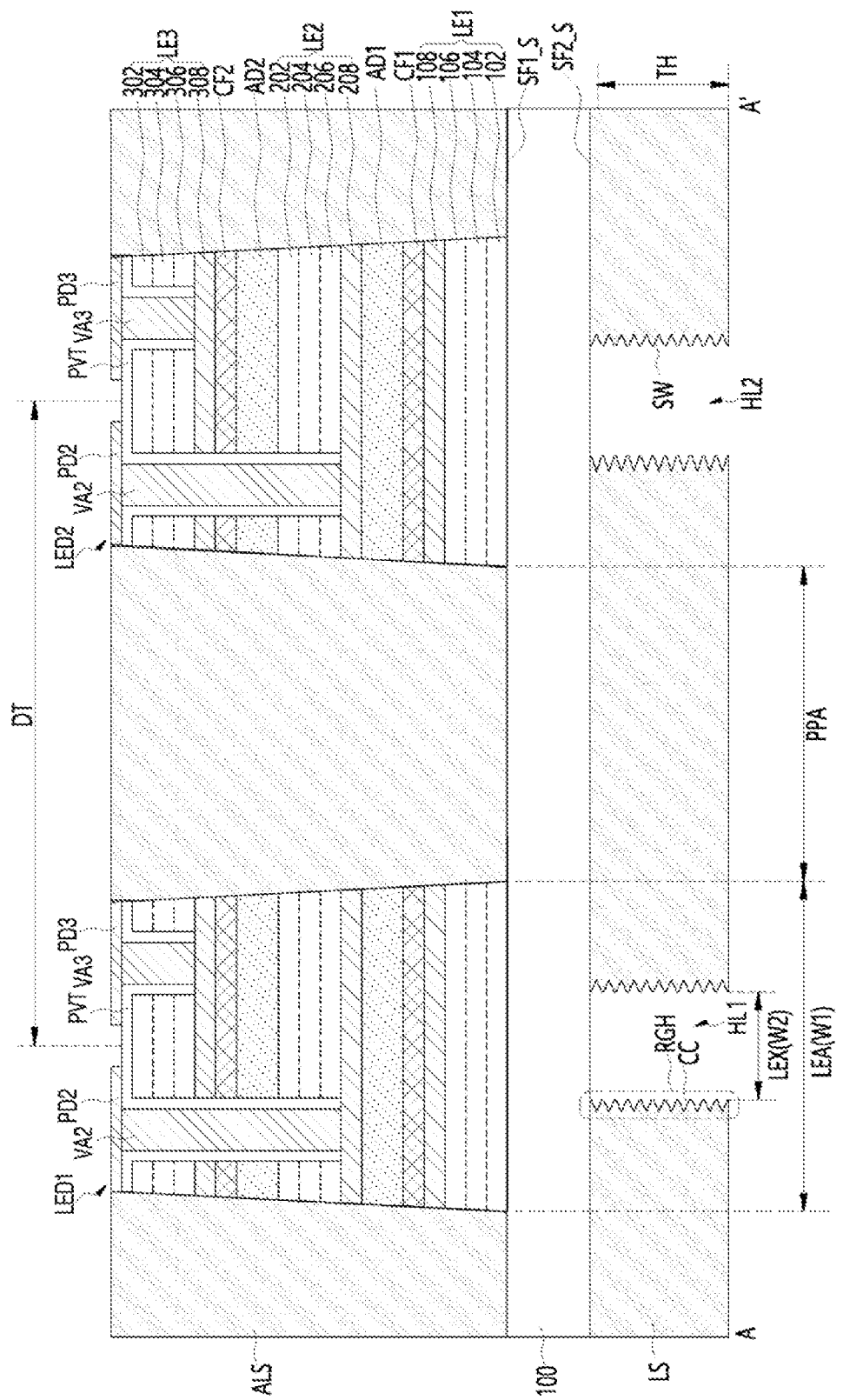

Referring to FIG. 2B, the sidewall SW exposed by the hole HL of the light shielding layer LS according to another exemplary embodiment may be vertical with respect to a longitudinal direction of the substrate 100, and include a rough surface RGH. The rough surface RGH may include a concave and convex pattern CC.

As described above, light generated from the first light emitting structure LED1 may be vanished while passing through the thick light shielding layer LS towards the second hole HL2. According to an exemplary embodiment, since the sidewall SW of the second hole HL2 is formed with the rough surface RGH, light generated from the first light emitting structure LED1 may be quickly and completely vanished as being diffusively reflected and scattered.

Figure 2C:
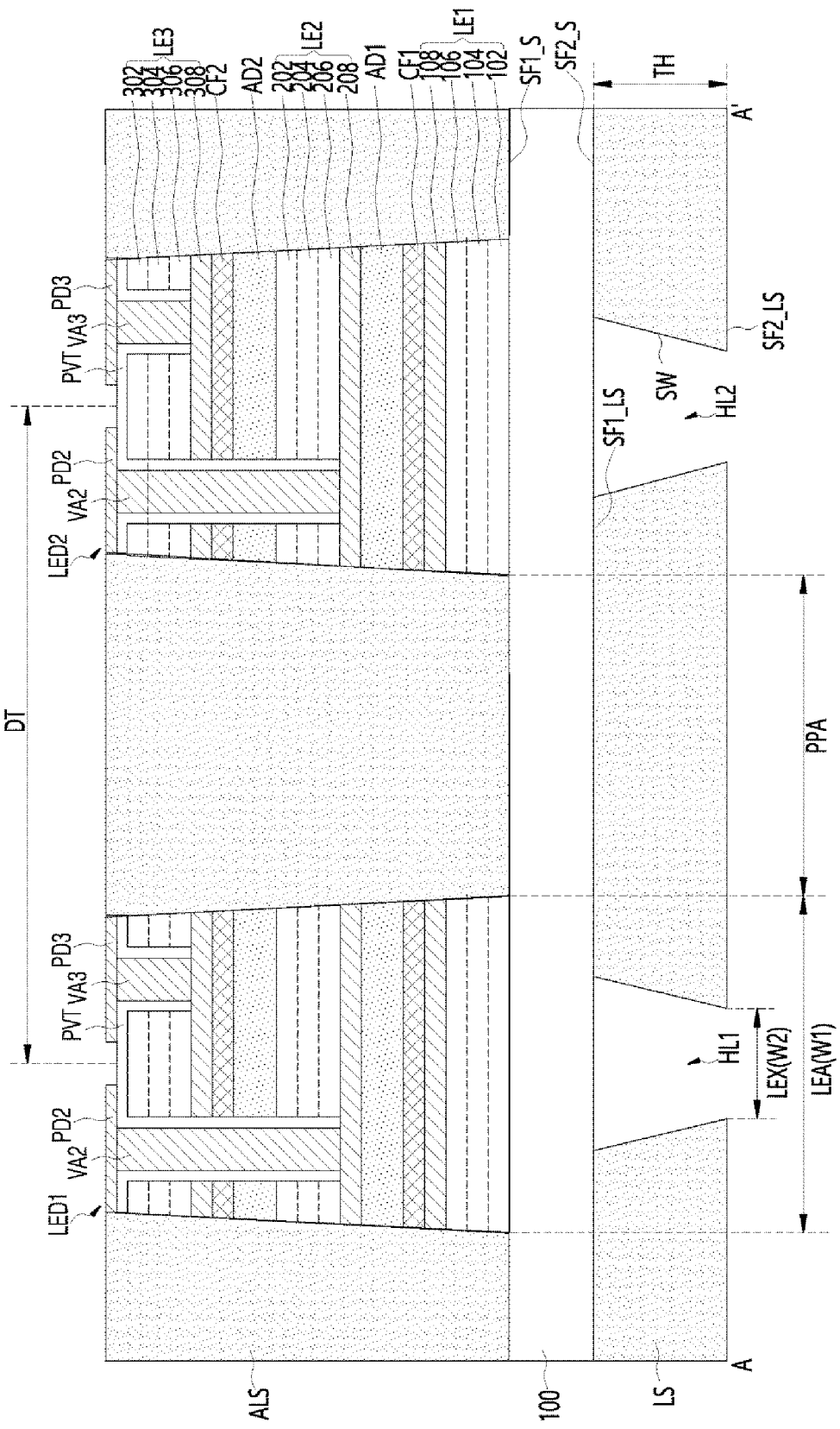

Referring to FIG. 2C, the sidewall SW exposed by the hole HL of the light shielding layer LS may have a slope. For example, the light shielding layer LS includes the first surface SF1_LS facing the second surface SF2_S of the substrate 100, and the second surface SF2_LS opposing the first surface SF1_LS, and the light shielding layer LS may have a width that gradually decreases from the second surface SF2_LS to the first surface SF1_LS of the light shielding layer LS. In particular, the sidewall SW of the light shielding layer LS may have a reverse slope. The area of the sidewall SW having the reverse slope may be greater than the area of the sidewall SW that is vertical.

As described above, light generated from the first light emitting structure LED1 may be vanished by the thick light shielding layer LS while passing through the second hole HL2. Since the sidewall SW of the second hole HL2 according to the illustrated exemplary embodiment has a sidewall which has a reverse slope, light radiated from various angles may be efficiently reflected and absorbed to be efficiently be vanished.

Figure 2D:
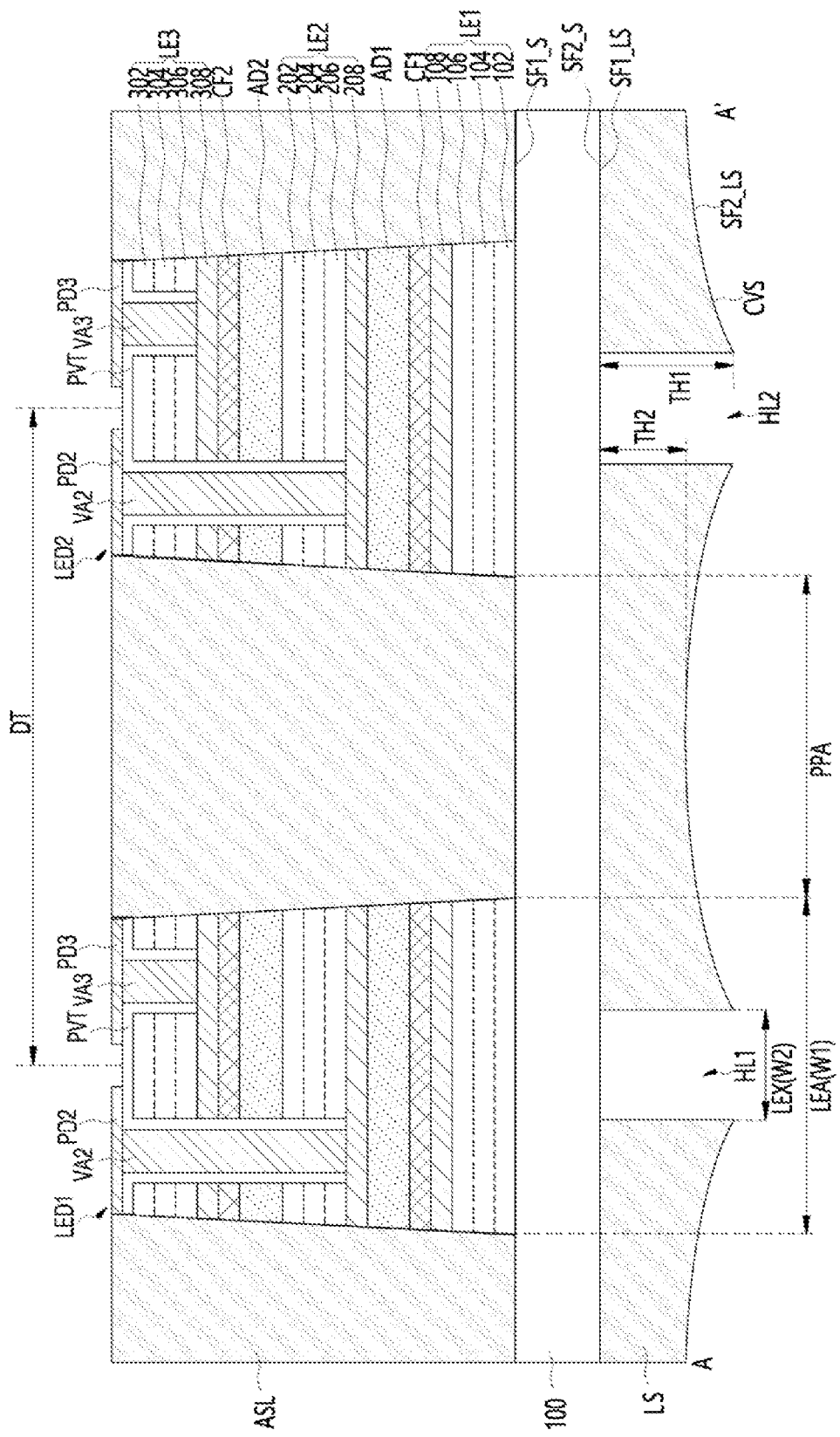

Referring to FIG. 2D, the light shielding layer LS includes the first surface SF1_LS facing the second surface SF2_S of the substrate 100, and the second surface SF2_LS opposing the first surface SF1_LS and having a concaved surface CVS. More particularly, the light shielding layer LS may have a thickness TH that gradually decreases from one end of the light shielding layer LS towards a center thereof. For example, one end (or an edge) of the light shielding layer LS may have a first thickness TH1, and the center of the light shielding layer LS may have a second thickness TH2 less than the first thickness TH. In this manner, since the thickness TH1 of the edge of the light shielding layer LS exposed by the hole HL may be relatively thick, the hole HL may have a longer depth, which may efficiently vanish light emitted from a neighboring light emitting structure LED as described above. Furthermore, since the center of the light shielding layer LS has a relatively thin thickness TH2, a tension to be applied to the light emitting device may be reduced, thereby preventing or at least suppressing the breakage of the light emitting device.

Hereinafter, a method for manufacturing a light emitting device according to an exemplary embodiment will be described. In the illustrated exemplary embodiment, the light emitting device will be described with reference to that shown in FIGS. 1A, 1B, and 2A.

FIGS. 4 to 8 cross-sectional views illustrating a method for manufacturing a light emitting device according to an exemplary embodiment.

Figure 4:
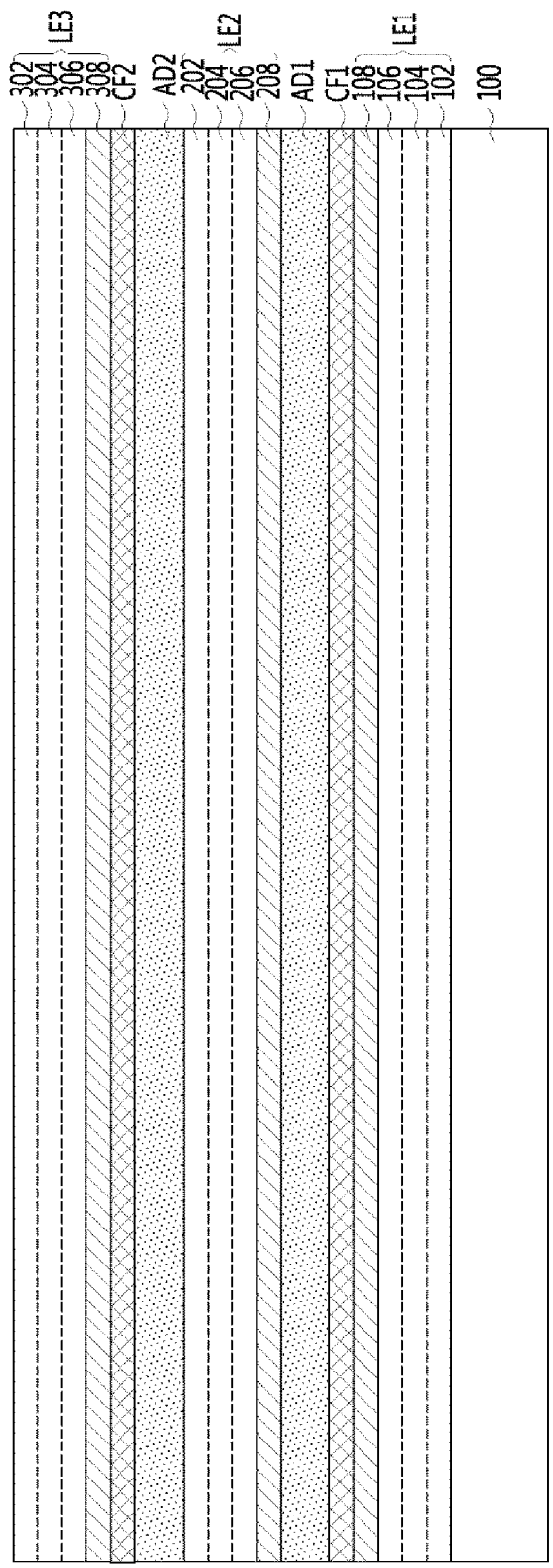
FIGS. 4, 5, 6, 7, and 8 are cross-sectional views illustrating a method for manufacturing a light emitting device according to an exemplary embodiment.

Referring to FIG. 4, a first light emitting part LE1, a second light emitting part LE2, and a third light emitting part LE3 may be sequentially stacked on a first surface of a first substrate 100.

According to an exemplary embodiment, the first substrate 100 may be a growth substrate capable of growing the first light emitting part LE1 thereon, and a transfer substrate for mounting the first light emitting part LE1 to a target apparatus. For example, when a completed light emitting device is applied to a display device, such as a wristwatch, the first substrate 100 may be cut to a size that corresponds to a display unit of the wristwatch, and then, the first light emitting part LE1 may be grown thereon.

A first n-type semiconductor layer 102, a first active layer 104, and a first p-type semiconductor layer 106 may be sequentially formed on the first substrate 100 by using a growing method, such as MOCVD (metal organic chemical vapor deposition), MBE (molecular beam epitaxy), HVPE (hydride vapor phase epitaxy), and MOC (metal-organic chloride). A first ohmic layer 108 may be formed on the first p-type semiconductor layer 106 through a chemical vapor deposition (CVD) process, a physical vapor deposition (PVD), etc., to form the first light emitting part LE1.

A second n-type semiconductor layer 202, a second active layer 204, and a second p-type semiconductor layer 206 may be sequentially formed on a second substrate by using a growing method, such as MOCVD, MBE, HVPE, and MOC. A second ohmic layer 208 may be formed on the second p-type semiconductor layer 206 through a CVD process, a PVD process, etc., to form the second light emitting part LE2.

By turning over the second substrate, the second ohmic layer 208 may be disposed to face the first ohmic layer 108, and the second light emitting part LE2 may be bonded to the first light emitting part LE1 through a first adhesion part AD1. After bonding the first light emitting part LE1 and the second light emitting part LE2, the second substrate may be removed through a laser lift-off (LLO) process or a chemical lift-off (CLO) process.

A third n-type semiconductor layer 302, a third active layer 304, and a third p-type semiconductor layer 306 may be sequentially formed on a third substrate by using a growing method, such as MOCVD, MBE, HVPE, and MOC. A third ohmic layer 308 may be formed on the third p-type semiconductor layer 306 through a CVD process, a PVD process, etc., to form the third light emitting part LE3.

The third substrate may be turned over, such that the second n-type semiconductor layer 202 of the second light emitting part LE2 and the third ohmic layer 308 of the third light emitting part LE3 face each other, and the second light emitting part LE2 and the third light emitting part LE3 may be bonded to each other through a second adhesion part AD2. After bonding the second light emitting part LE2 and the third light emitting part LE3 by the second adhesion part AD2, the third substrate may be removed through an LLO or CLO process.

Figure 5:
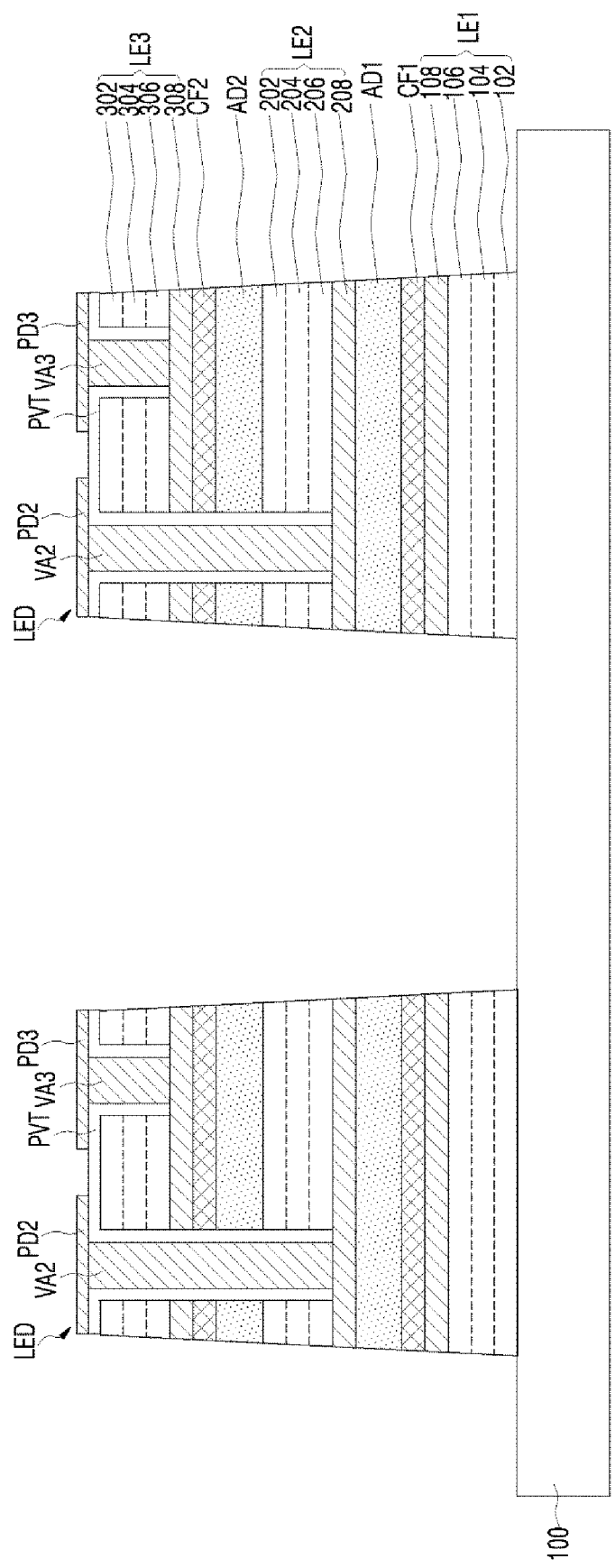

Referring to FIGS. 3B and 5, by etching the third light emitting part LE3, the second light emitting part LE2, and the first light emitting part LE1, a first via hole exposing the first ohmic layer 108, a second via hole exposing the second ohmic layer 208, a third via hole exposing the third ohmic layer 308, a fourth via hole exposing the first n-type semiconductor layer 102, a fifth via hole exposing the second n-type semiconductor layer 202, and a sixth via hole exposing the third n-type semiconductor layer 302 may be formed.

According to an exemplary embodiment, while forming the first via hole, the second via hole, the third via hole, the fourth via hole, the fifth via hole, and the sixth via hole, by etching the first light emitting part LE1, the second light emitting part LE2, and the third light emitting part LE3, a plurality of light emitting structures LED may be isolated on the first surface of the first substrate 100.

A passivation layer PVT may be formed in at least a portion of the first via hole, the second via hole, the third via hole, the fourth via hole, the fifth via hole, and the sixth via hole, and to extend to the top surface of the third n-type semiconductor layer 302.

By etching the passivation layer PVT, the first ohmic layer 108 may be exposed at the bottom surface of the first via hole, the second ohmic layer 208 may be exposed at the bottom surface of the second via hole, the third ohmic layer 308 may be exposed at the bottom surface of the third via hole, the first n-type semiconductor layer 102 may be exposed at the bottom surface of the fourth via hole, the second n-type semiconductor layer 202 may be exposed at the bottom surface of the fifth via hole, and the third n-type semiconductor layer 302 may be exposed at the bottom surface of the sixth ohmic layer.

A first via pattern VA1, a second via pattern VA2, a third via pattern VA3, a fourth via pattern VA4, a fifth via pattern VA5, and a sixth via pattern VA6 may be disposed in the first via hole, the second via hole, the third via hole, the fourth via hole, the fifth via hole, and the sixth via hole, respectively, along with the passivation layer PVT.

A first pad PD1 may be formed on the first via pattern VA1, a second pad PD2 may be formed on the second via pattern VA2, a third pad PD3 may be formed on the third via pattern VA3, and a common pad CPD may be formed to be electrically coupled in common with the fourth via pattern VA4, the fifth via pattern VA5, and the sixth via pattern VA6.

Figure 6:
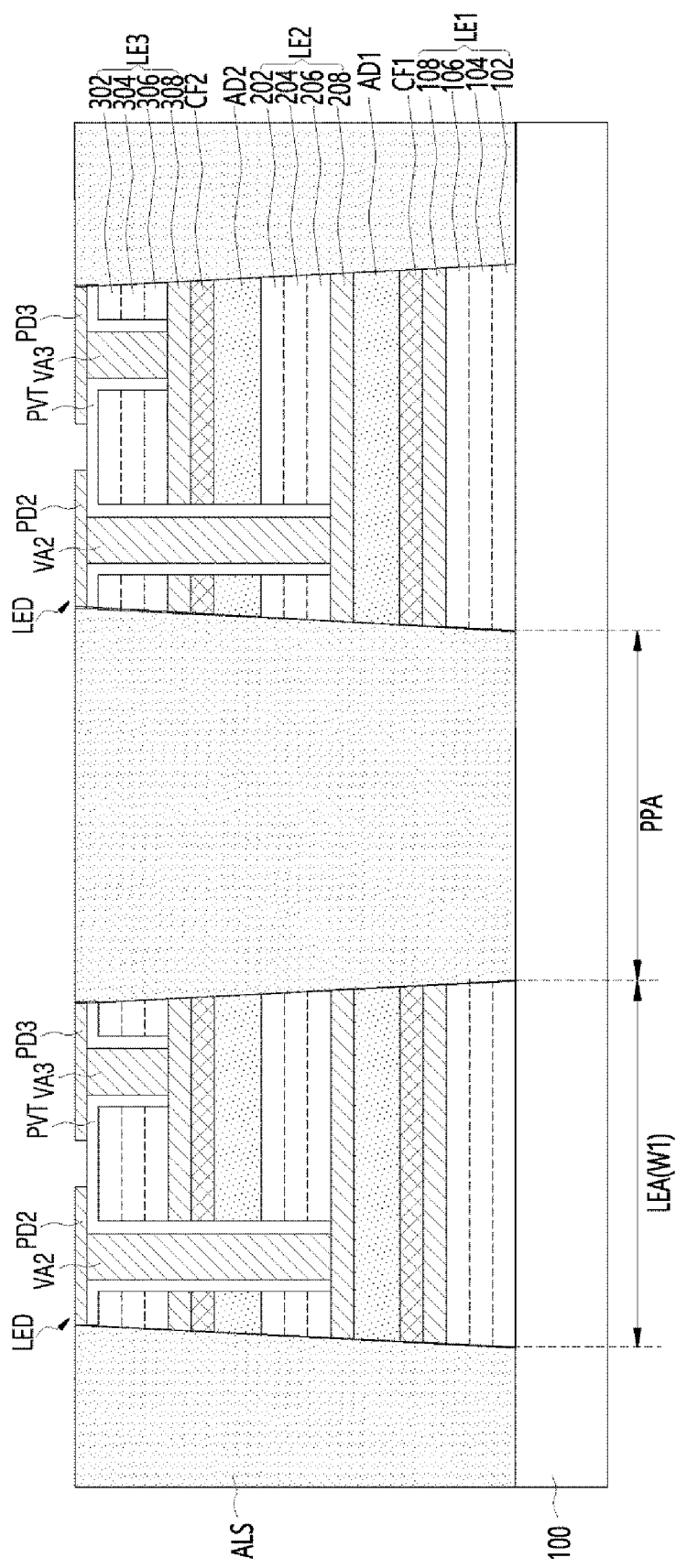

Referring to FIG. 6, an additional light shielding layer ALS may be disposed on the first surface of the first substrate 100 between the light emitting structures LED. A peripheral area PPA around the light emitting areas LEA, in which the light emitting structures LED are formed, may be covered by the additional light shielding layer ALS.

Figure 7:
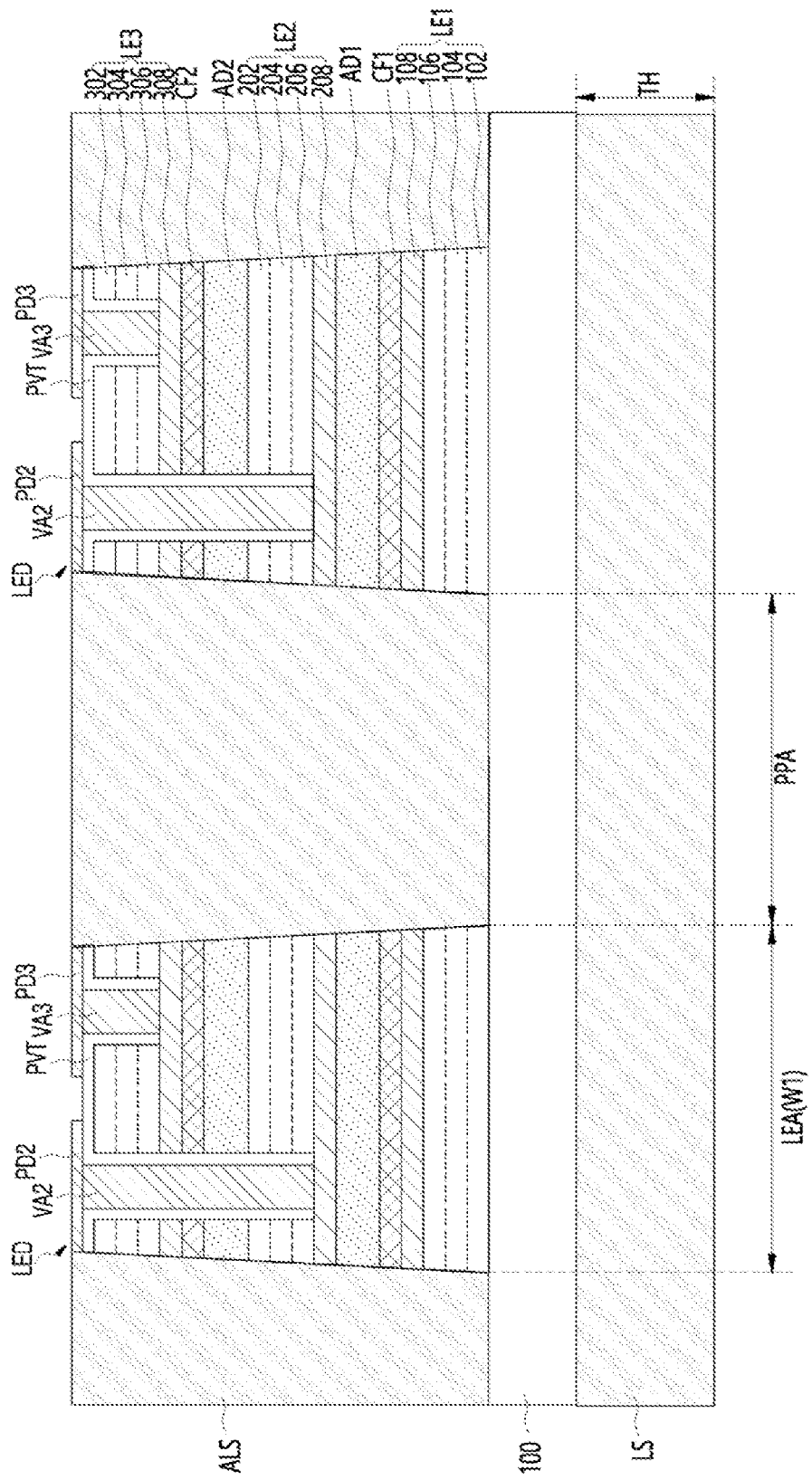

Referring to FIG. 7, a light shielding layer LS may be formed on a second surface of the first substrate 100. According to an exemplary embodiment, the light shielding layer LS may have a thickness TH that is greater than the wavelength of the light generated from the third light emitting part LE3.

Figure 8:
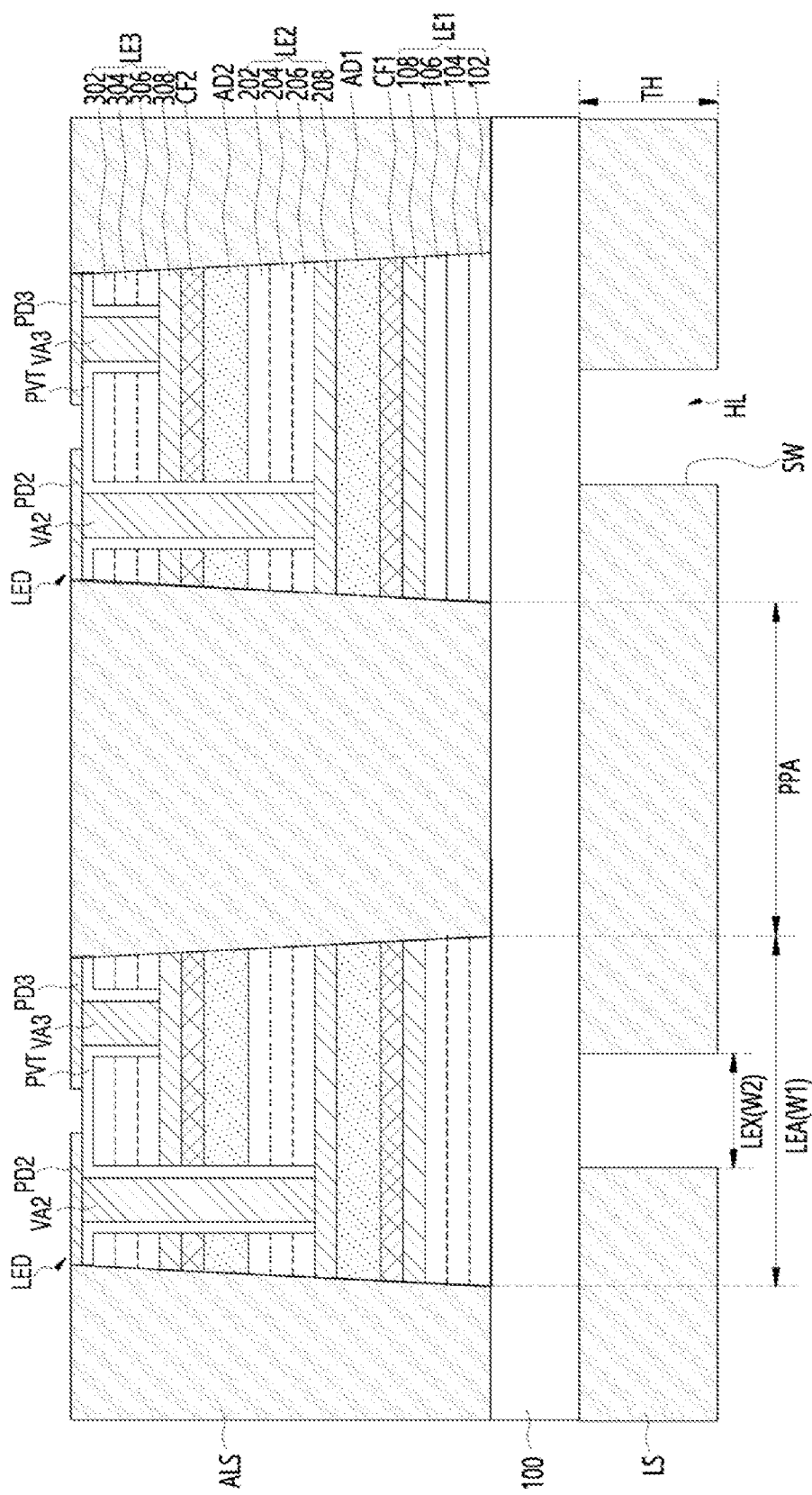

Referring to FIG. 8, by forming a mask pattern on the light shielding layer LS and etching the light shielding layer LS through using the mask pattern as an etch mask, holes HL each exposing at least a portion of each of the light emitting areas LEA may be formed. Each of the holes HL may function as a light extraction path, through which light from each of the light emitting structures LED is emitted. According to an exemplary embodiment, each hole HL may be formed within each light emitting area LEA, and the center of each hole HL may be substantially the same as the center of each light emitting area LEA.

Referring back to FIG. 2A, a sidewall SW of the light shielding layer LS exposed by each hole HL may be vertical with respect to the substrate 100. The mask pattern may be selected, such that the sidewall SW of the light shielding layer LS is vertically etched.

Referring back to FIG. 2B, by etching a sidewall SW of the light shielding layer LS that is vertical through using a mask pattern as an etch mask, a rough surface RGH may be formed by an etching process, such as wet etching, for example.

Referring back to FIG. 2C, a sidewall SW of the light shielding layer LS exposed by each hole HL may have a reverse slope. The mask pattern may be selected, such that the sidewall SW of the light shielding layer LS is etched to have a reversely sloped surface.

Referring back to FIG. 2D, when the light shielding layer LS has a first surface SF1_LS facing a second surface SF2_S of the substrate 100, and a second surface SF2_LS opposing the first surface SF1_LS, a concave may be formed on the second surface SF2_LS of the light shielding layer LS through a CMP process or the like. More particularly, the light shielding layer LS may have a thickness TH that gradually decreases from an edge to the center of the light shielding layer LS.

As such, a light emitting device including the light emitting structures LED, the light shielding layer LS, and the additional light shielding layer ALS may be formed on the first substrate 100. Since the first substrate 100 may be cut to a size that corresponds to the display unit of a target mounting apparatus, for example, the processes of cutting, transferring, and mounting the light emitting structures LED formed on the first substrate 100 may be obviated, and the first substrate 100 may be directly mounted to the target apparatus. In this manner, a light emitting device according to an exemplary embodiment may be easily be mounted to the target apparatus, while obviating the need of separate cutting, transferring, and/or mounting process, which otherwise would increase the manufacturing costs and complexity, especially when the size of a light emitting device is small.

In the light emitting device according to the exemplary embodiments, since a light extraction surface that is smaller than a light emitting area is defined by using a light shielding layer, the contrast of the light emitting device may be improved. In addition, since the light shielding layer according to exemplary embodiments has a sufficient thickness to cause the diffraction of light emitted through the light extraction surface having a narrow width to be vanished, the image blurring of a display device may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a substrate having a first surface and a second surface opposing each other;
a plurality of light emitting structures directly disposed on the first surface of the substrate and defining a light emitting area;
a light shielding layer disposed on the second surface of the substrate;
a plurality of pads disposed on the light emitting structures; and
a light blocking layer disposed on the first surface of the substrate,
wherein distances between centers of adjacent light emitting structures are constant,
wherein the light shielding layer has a thickness greater than a length of the longest wavelength among wavelengths of light generated from the light emitting structures, and
wherein an upper surface of each pad faces away from the substrate and an upper surface of the light blocking layer faces away from the substrate.

2. The light emitting device according to claim 1, wherein the light shielding layer defines a light extraction surface by covering peripheries of the light emitting area.

3. The light emitting device according to claim 2, wherein a width of the light extraction surface is less than the thickness of the light shielding layer.

4. The light emitting device according to claim 1, wherein the light shielding layer has a side surface including a rough surface.

5. The light emitting device according to claim 1, wherein:
the light shielding layer includes a first surface facing the second surface of the substrate and a second surface opposing the first surface thereof; and
the second surface of the light shielding layer has a concaved surface.

6. The light emitting device according to claim 1, wherein the light shielding layer has a sidewall that is vertical with respect to a longitudinal direction of the substrate.

7. The light emitting device according to claim 1, wherein the light shielding layer has an inclined sidewall with respect to a longitudinal direction of the substrate.

8. The light emitting device according to claim 7, wherein:
the light shielding layer has a first surface facing the second surface of the substrate and a second surface opposing the first surface thereof; and
the light shielding layer has a width that increases from the first surface of the light shielding layer to the second surface of the light shielding layer.

9. A light emitting device comprising:
a substrate having a first surface and a second surface opposing each other;
a plurality of light emitting structures disposed on the first surface of the substrate, each light emitting structure comprising:
a plurality of light emitting parts disposed one over another on the first surface of the substrate;
a plurality of vias at least partially passing through one of the light emitting parts; and
a plurality of pads disposed on the light emitting parts and electrically connected to each of the light emitting parts through the vias; and
a first shielding layer disposed on the first surface of the substrate between the light emitting structures,
wherein an upper surface of each pad facing away from the substrate and an upper surface of the first shielding layer facing away from the substrate are disposed on the same plane.

10. The light emitting device according to claim 9, wherein the first shielding layer contacts a side surface of the pads.

11. The light emitting device according to claim 9, wherein a sidewall of each of the light emitting parts is linearly inclined with respect to a longitudinal direction of the substrate at a predetermined angle.

12. The light emitting device according to claim 9, wherein at least one of the light emitting parts is configured to emit light having a wavelength different from those emitted from the remaining light emitting parts.

13. The light emitting device according to claim 9, wherein at least one of the pads is electrically connected to each of the light emitting parts.

14. The light emitting device according to claim 9, wherein:
   each of the light emitting parts includes a first-type semiconductor layer, an active layer, and a second-type semiconductor layer disposed one over another along a first direction; and
   at least one of the light emitting parts has a stacked sequence of the first-type semiconductor layer, the active layer, and the second-type semiconductor layer different from those of the remaining light emitting parts along the first direction.

15. The light emitting device according to claim 9, wherein:
   each of the pads overlaps at least one of the vias in plan view; and
   a first one of the pads overlaps a greater number of the vias than the remaining pads.

16. The light emitting device according to claim 15, wherein:
   each of the light emitting parts includes a first-type semiconductor layer, an active layer, and a second-type semiconductor layer disposed one over another along a first direction; and
   the vias electrically connected to the first one of the pads are electrically connected to the same-type semiconductor layers of the light emitting parts, respectively.

17. The light emitting device according to claim 16, wherein at least one of the first-type semiconductor layer and the second-type semiconductor layer further includes an ohmic layer.

18. The light emitting device according to claim 9, further comprising a second shielding layer disposed on the second surface of the substrate.

19. The light emitting device according to claim 18, wherein the second shielding layer includes a plurality of openings disposed to respectively overlap at least a portion of the light emitting parts and exposing the substrate.

20. The light emitting device according to claim 19, wherein:
   the second shielding layer includes a first surface facing away the substrate and a side surface defined by the openings; and
   the first surface and the side surface of the second shielding layer have different shapes.

* * * * *